(12) United States Patent
Heeney et al.

(10) Patent No.: US 8,529,794 B2
(45) Date of Patent: Sep. 10, 2013

(54) POLYMERS COMPRISING FUSED SELENOPHENE

(75) Inventors: Martin Heeney, Southampton (GB);
Weimin Zhang, Southampton (GB);
Steven Tierney, Southampton (GB);
Iain McCulloch, Southampton (GB)

(73) Assignee: Merck Patent GmbH, Darmstadt (DE)

( * ) Notice: Subject to any disclaimer, the term of this patent is extended or adjusted under 35 U.S.C. 154(b) by 834 days.

(21) Appl. No.: 12/520,306

(22) PCT Filed: Dec. 8, 2007

(86) PCT No.: PCT/EP2007/010704
§ 371 (c)(1),
(2), (4) Date: Jun. 19, 2009

(87) PCT Pub. No.: WO2008/077465
PCT Pub. Date: Jul. 3, 2008

(65) Prior Publication Data
US 2009/0278093 A1   Nov. 12, 2009

(30) Foreign Application Priority Data

Dec. 22, 2006 (EP) .................... 06026786

(51) Int. Cl.
*H01B 1/12* (2006.01)
*C08G 61/12* (2006.01)

(52) U.S. Cl.
USPC ........................... 252/500; 549/50

(58) Field of Classification Search
USPC ....................... 252/500; 549/9, 50
See application file for complete search history.

(56) References Cited

U.S. PATENT DOCUMENTS

| 4,663,001 | A | 5/1987 | Lazzaroni et al. | |
|---|---|---|---|---|
| 7,700,643 | B2 * | 4/2010 | Heeney et al. | 514/444 |
| 7,714,098 | B2 * | 5/2010 | Heeney et al. | 528/377 |
| 7,981,323 | B2 * | 7/2011 | Zahn | 252/500 |
| 2007/0045592 | A1 * | 3/2007 | Tierney et al. | 252/500 |

FOREIGN PATENT DOCUMENTS

| EP | 1754736 A1 | 2/2007 |
|---|---|---|
| JP | 2006089413 A2 | 4/2006 |
| JP | 2006089413 T | 4/2006 |
| WO | 2005111045 A1 | 11/2005 |

OTHER PUBLICATIONS

Coakley, Kevin M., et al. "Conjugated Polymer Photovoltaic Cells." (Chemistry Materials), 2004, 4533-4542, 16.
Nakayama, Juzo, et al. "Synthesis and Characterization of Dimers, Trimers, and Tetramers of 3,6-Dimethylthieno [3,2-b]thiophene and 3,6-Dimethylselenolo[3,2-b]selenophene." (Tetrahedron), Jan. 8, 1996, 471-488, 52:2.

* cited by examiner

*Primary Examiner* — Mark Kopec
(74) *Attorney, Agent, or Firm* — Millen, White, Zelano & Branigan, P.C.

(57) ABSTRACT

The invention relates to polymers comprising fused selenophene rings, to their use as semiconductors or charge transport materials in optical, electrooptical or electronic devices, and to optical, electrooptical or electronic devices comprising them.

10 Claims, No Drawings

POLYMERS COMPRISING FUSED SELENOPHENE

FIELD OF INVENTION

The invention relates to polymers comprising fused selenophene rings, to their use as semiconductors or charge transport materials in optical, electrooptical or electronic devices, and to optical, electrooptical or electronic devices comprising them.

BACKGROUND AND PRIOR ART

In recent years there has been growing interest in the use of organic polymers for electronic applications. For example, organic polymers have shown promise as the active layer in organic based thin film transistors and organic field effect transistors (TFT, OFET) (see H. E. Katz, Z. Bao and S. L. Gilat, *Acc. Chem. Res.*, 2001, 34, 5, 359). Such devices have potential applications in smart cards, security tags and switching elements in flat panel displays. Organic materials are envisaged to have substantial cost advantages over their silicon analogues if they can be deposited from solution, as this enables a fast, large-area fabrication route.

The performance of the device is principally based upon the charge carrier mobility of the semiconducting material and the current on/off ratio, so the ideal semiconductor should have a low conductivity in the off state, combined with a high charge carrier mobility ($>1\times10^{-3}$ cm$^2$ V$^{-1}$ s$^{-1}$). In addition, it is important that the semi-conducting material is relatively stable to oxidation i.e. it has a high ionisation potential, as oxidation leads to reduced device performance.

Regioregular head-to-tail poly(3-hexyl-thiophene) (P3HT) has been reported with charge carrier mobility between $1\times10^{-5}$ and $4.5\times10^{-2}$ cm$^2$V$^{-1}$ s$^{-1}$, but with a rather low current on/off ratio between 10 and $10^3$ (see Z. Bao et al., *Appl. Pys. Lett.*, 1996, 69, 4108). This low on/off current is due in part to the low ionisation potential of the polymer, which can lead to oxygen doping of the polymer under ambient conditions, and a subsequent high off current (see H. Sirringhaus et al., *Adv. Solid State Phys.*, 1999, 39, 101).

A high regioregularity leads to improved packing and optimised microstructure, leading to improved charge carrier mobility (see H. Sirringhaus et al., *Science*, 1998, 280, 1741-1744; H. Sirringhaus et al., *Nature*, 1999, 401, 685-688; and H. Sirringhaus, et al., *Synthetic Metals*, 2000,111-112, 129-132). In general, poly(3-alkyl-thiophenes) (P3AT) show improved solubility and are able to be solution processed to fabricate large area films. However, P3AT have relatively low ionisation potentials and are susceptible to doping in air.

Another particular area of importance is organic photovoltaics (OPV). Organic polymers have found use in OPVs as they allow devices to be manufactured by solution-processing techniques such as spin casting, dip coating or ink jet printing. Solution processing can be carried out cheaper and on a larger scale compared to the evaporative techniques used to make inorganic thin film devices. Currently, polymer based devices are achieving efficiencies up to 4-5% (see for example K. M. Coakley and M. D. McGehee, *Chem. Mater.* 2004, 16, 4533-4542). This is appreciably lower than the efficiencies attainable by inorganic devices, which are typically up to 25%.

The class of polymers currently achieving the highest efficiencies in OPV devices are P3AT. The most commonly used example is P3HT, due to its broad availability and good absorption characteristics. However, P3HT absorbs strongly over the range from 480 to 650 nm, with a peak maximum absorption at 560 nm. This means a significant portion of the light emitted by the sun is not being absorbed, which is a disadvantage for use in OPV devices. In order to improve the efficiency of OPV devices, polymers are required that absorb more light from the longer wavelength region (650 to 800 nm) of the solar spectra. For this purpose, polymers are desired which have a low band gap, preferably less than 1.9 eV, whereas for example P3HT has a band gap of ~2.0 eV.

One strategy to further improve photovoltaic efficiency is the development of polythiophene analogues that can capture more of the photon flux from the solar spectrum. This is achieved by reducing the bandgap of the semiconducting polymer. A common strategy to reduce the bandgap of the polymer is the donor-acceptor approach, whereupon electron-rich and electron-poor units are co-polymerised in a polymer backbone. The polymer tends to take the HOMO of the electron rich unit and the LUMO of the electron poor unit, resulting in a low overall bandgap (see Roncali, J. *Chem. Rev.* 1997, 97, '73) However, an undesirable consequence with this approach is a reduction in the open circuit voltage of the device (VOC), and therefore a reduction in cell efficiency (see Koster, L. J. A.; Mihailetchi, V. D.; Blom, P. W. M. *Appl. Phys. Lett.* 2006, 88, 093511) The VOC in bulk heterojunction devices is derived primarily by the energy difference between the highest occupied molecular orbital (HOMO) of the donor, and the lowest unoccupied molecular orbital (LUMO) of the acceptor (see Scharber, M. C.; Muhlbacher, D.; Koppe, M.; Denk, P.; Waldauf, C.; Heeger, A. J.; Brabec, C. J. *Adv. Mater.* 2006, 18, 789) Therefore the above-mentioned strategy to reduce polymer bandgap has the disadvantage of raising the polymer HOMO level (the HOMO level is moved closer to vacuum level).

In McCulloch et al., Nature Materials 2006, 5(4), 328-333 it has been reported that polymers incorporating thieno[3,2-b]thiophene exhibit very high charge carrier mobilities (up to 0.6 cm$^2$/Vs) in organic field effect transistors. However, whilst these polymers are useful for OFET devices, the maximum absorption wavelength (550 nm) of the polymer is not optimal for use in OPV devices. As mentioned above, for these devices it is desired to capture the maximum amount of energy from the sun, which has a maximum photon flux around 700 nm.

It is an aim of the present invention to provide new and improved materials for use as semiconductors or charge transport materials, especially for use in OPV and OFET devices, which do not have the disadvantages as mentioned above, and are easy to synthesize, have high charge mobility, good processability and oxidative stability. Another aim of the invention is to provide new semiconductor and charge transport components, and new and improved electrooptical, electronic and luminescent devices comprising these components. Other aims of the invention are immediately evident to those skilled in the art from the following description.

The inventors of the present invention have found that these aims can be achieved by providing polymers comprising fused selenophene rings as described hereinafter. Surprisingly it was found that, especially polymers containing fused selenopheno[3,2-b]thiophene and selenopheno[3,2-b]selenophene, have smaller bandgaps in comparison to the analogous all-sulfur systems. In addition, the inventors of the present invention have found that the inclusion of selenopheno[3,2-b]thiophene into polymer backbone surprisingly results in an improvement of the solubility of the polymer without affecting the ability of the polymer to self-organise and pack into highly ordered films. (see comment also on page 18)

JP 2006-089413 A discloses low molar mass compounds comprising a selenopheno[3,2-b]selenophene group, but does not disclose polymers according to the present invention. In addition JP2006089413A does not disclose selenopheno[3,2-b]selenophene or selenopheno[3,2-b]thiophenes that are substituted in the 3,6-positions with solubilising sidechains, or methods to prepare such compounds. Unsubstituted selenopheno[3,2-b]selenophene in combination with aromatic units containing solubilising sidechains are also not disclosed. The use of such sidechains is important, not only in providing solubility to the polymer, but also in driving self-organisation of the polymer backbone by interdigitation of the sidechains on adjacent polymer backbones. This self-organisation allows closer packing of the polymer backbones and is critical in enabling the polymer to pack closely in transistor devices, since charge is carried by a hopping mechanism from one molecule to an adjacent molecule. In addition, organic photovoltaic cells utilise a blend of a p-type and n-type component that must phase separation on the nano-scale in order to promote efficient excitation diffusion to the interface, splitting of the excitation into holes and electrons and subsequent collection of the charges at the respective electrodes (see Padinger, J.; Rittberger, R. S.; Sariciftci, N. S. *Adv. Funct. Mater.* 2003, 13, 85) Without phase separation this process is inefficient resulting in low performing cells. The inventors of the present invention have found that the self-organisational abilities of the presently reported polymers promotes such phase separation in an annealed blended film with typical n-type component such as PCBM (6,6}-phenyl C61-butyric acid methyl ester).

SUMMARY OF THE INVENTION

The invention relates to a polymer of formula I

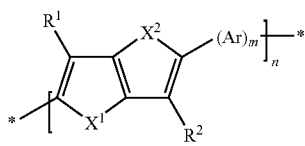

I wherein
one of $X^1$ and $X^2$ is Se and the other is S or Se,
$R^1$ and $R^2$ are independently of each other identical or different groups selected from H, halogen, —CN, —NC, —NCO, —NCS, —OCN, —SCN, —C(=O)NR$^0$R$^{00}$, —C(=O)X$^0$, —C(=O)R$^0$, —NH$_2$, —NR$^0$R$^{00}$, —SH, —SR$^0$, —SO$_3$H, —SO$_2$R$^0$, —OH, —NO$_2$, —CF$_3$, —SF$_5$, P-Sp-, optionally substituted silyl, or carbyl or hydrocarbyl with 1 to 40 C atoms that is optionally substituted and optionally comprises one or more hetero atoms,
P is a polymerisable group,
Sp is a spacer group or a single bond,
$X^0$ is halogen,
$R^0$ and $R^{00}$ are independently of each other H or an optionally substituted aliphatic or aromatic hydrocarbon group having 1 to 20 C atoms,
Ar in case of multiple occurrence independently of one another —CY$^1$=CY$^2$, —C≡C— or mono- or polynuclear aryl or heteroaryl that is optionally substituted,
$Y^1$ and $Y^2$ are independently of each other H, F, Cl or CN,
m is 0, 1, 2, 3 or 4 and
n is an integer>10.
The invention further relates to a polymer blend comprising one or more polymers according to the present invention and one or more polymers, preferably selected from polymers having semiconducting, charge transport, hole/electron transport, hole/electron blocking, electrically conducting, photoconducting or light emitting properties.

The invention further relates to a formulation comprising one or more polymers or polymer blends according to the present invention and one or more solvents, preferably selected from organic solvents.

The invention further relates to the use of polymers, polymer blends and formulations according to the present invention as charge transport, semiconducting, electrically conducting, photoconducting or light emitting material in optical, electrooptical, electronic, electroluminescent or photoluminescent components or devices.

The invention further relates to a charge transport, semiconducting, electrically conducting, photoconducting or light emitting material or component comprising one or more polymers, polymer blends of formulations according to the present invention.

The invention further relates to an optical, electrooptical or electronic component or device comprising one or more polymers, polymer blends, formulations, components or materials according to the present invention.

The optical, electrooptical, electronic electroluminescent and photoluminescent components or devices include, without limitation, organic field effect transistors (OFET), thin film transistors (TFT), integrated circuits (IC), logic circuits, capacitors, radio frequency identification (RFID) tags, devices or components, organic light emitting diodes (OLED), organic light emitting transistors (OLET), flat panel displays, backlights of displays, organic photovoltaic devices (OPV), solar cells, laser diodes, photoconductors, photodetectors, electrophotographic devices, electrophotographic recording devices, organic memory devices, sensor devices, charge injection layers, Schottky diodes, planarising layers, antistatic films, conducting substrates, conducting patterns, electrode materials in batteries, alignment layers, biosensors, biochips, security markings, security devices, and components or devices for detecting and discriminating DNA sequences.

DETAILED DESCRIPTION OF THE INVENTION

The term "polymer" includes homopolymers and copolymers, e.g. statistical, alternating or block copolymers. In addition, the term "polymer" as used hereinafter does also include dendrimers, which are typically branched macromolecular compounds consisting of a multifunctional core group onto which further branched monomers are added in a regular way giving a tree-like structure, as described for example in M. Fischer and F. Vögtle, *Angew. Chem., Int. Ed.* 1999, 38, 885.

The term "conjugated polymer" means a polymer containing in its backbone (or main chain) mainly C atoms with sp$^2$-hybridisation, or optionally also sp-hybridisation, which may also be replaced by hetero atoms. In the simplest case this is for example a backbone with alternating C—C single and double, or triple, bonds, but does also include polymers with units like 1,3-phenylene. "Mainly" means in this connection that a polymer with naturally (spontaneously) occurring defects, which may lead to interruption of the conjugation, is still regarded as a conjugated polymer. Also included in this meaning are polymers wherein the backbone comprises for example units like aryl amines, aryl phosphines and/or certain heterocycles (i.e. conjugation via N-, O-, P- or S-atoms) and/or metal organic complexes (i.e. conjugation via a metal atom).

The term "regioregular" means a polymer with a regioregularity of at least 85%. "Regioregularity" means the number of head-to-tail couplings of monomer units in the polymer, divided by the number of total couplings, and expressed as a percentage. Especially preferred are polymers with a regioregularity of 90% or higher, very preferably 95% or higher, more preferably from 96% to 100%, most preferably from 98% to 100%.

The term "charge/hole/electron transport property" refers to a material capable of transporting charges, holes (i.e. positive charges) or electrons (i.e. negative charges) injected from a charge/hole/electron injecting material or an electrode (anode in case of holes and cathode in case of electrons). The term "light emitting property" refers to a material which, upon receiving excitonic energy by energy transfer from other units, or by forming an exciton either electrically or optically, undergoes radiative decay to emit light. The term "hole/electron blocking property" refers to a material which, if coated adjacent to an hole/electron transporting layer in a multilayer structure, prevents the hole/electron flowing through.

Unless stated otherwise, the molecular weight is given as the number average molecular weight M, determined by gel permeation chromatography (GPC) in a suitable solvent, like for example chloroform or chlorobenzene, against polystyrene standards. The degree of polymerization (n) means the number average degree of polymerization, given as $n=M_n/M_U$, wherein $M_U$ is the molecular weight of the single repeating unit (usually without considering the end groups of the polymer which are not part of the repeating unit, like groups $X^{21}$ and $X^{22}$ in formula II).

The term "carbyl group" as used above and below denotes any monovalent or multivalent organic radical moiety which comprises at least one carbon atom either without any non-carbon atoms (like for example —C≡C—), or optionally combined with at least one non-carbon atom such as N, O, S, P, Si, Se, As, Te or Ge (for example carbonyl etc.). The term "hydrocarbyl group" denotes a carbyl group that does additionally contain one or more H atoms and optionally contains one or more hetero atoms like for example N, O, S, P, Si, Se, As, Te or Ge.

A carbyl or hydrocarbyl group comprising a chain of 3 or more C atoms may also be linear, branched and/or cyclic, including spiro and/or fused rings.

Preferred carbyl and hydrocarbyl groups include alkyl, alkoxy, alkylcarbonyl, alkoxycarbonyl, alkylcarbonyloxy and alkoxycarbonyloxy, each of which is optionally substituted and has 1 to 40, preferably 1 to 25, very preferably 1 to 18 C atoms, furthermore optionally substituted aryl or aryloxy having 6 to 40, preferably 6 to 25 C atoms, furthermore alkylaryloxy, arylcarbonyl, aryloxycarbonyl, arylcarbonyloxy and aryloxycarbonyloxy, each of which is optionally substituted and has 6 to 40, preferably 7 to 40 C atoms.

The carbyl or hydrocarbyl group may be a saturated or unsaturated acyclic group, or a saturated or unsaturated cyclic group. Unsaturated acyclic or cyclic groups are preferred, especially aryl, alkenyl and alkynyl groups (especially ethynyl). Where the $C_1$-$C_{40}$ carbyl or hydrocarbyl group is acyclic, the group may be linear or branched. The $C_1$-$C_{40}$ carbyl or hydrocarbyl group includes for example: a $C_1$-$C_{40}$ alkyl group, a $C_2$-$C_{40}$ alkenyl group, a $C_2$-$C_{40}$ alkynyl group, a $C_3$-$C_{40}$ alkyl group, a $C_4$-$C_{40}$ alkyldienyl group, a $C_4$-$C_{40}$ polyenyl group, a $C_6$-$C_{18}$ aryl group, a $C_2$-$C_{18}$ heteroaryl group, a $C_6$-$C_{40}$ alkylaryl group, a $C_6$-$C_{40}$ arylalkyl group, a $C_4$-$C_{40}$ cycloalkyl group, a $C_4$-$C_{40}$ cycloalkenyl group, and the like. Preferred among the foregoing groups are a $C_1$-$C_{20}$ alkyl group, a $C_2$-$C_{20}$ alkenyl group, a $C_2$-$C_{20}$ alkynyl group, a $C_3$-$C_{20}$ alkyl group, a $C_4$-$C_{20}$ alkyldienyl group, a $C_6$-$C_{12}$ aryl group, a $C_2$-$C_{12}$ heteroaryl group and a $C_4$-$C_{20}$ polyenyl group, respectively. Also included are combinations of groups having carbon atoms and groups having hetero atoms, like e.g. an alkynyl group, preferably ethynyl, that is substituted with a silyl group, preferably a trialkylsilyl group.

Further preferred carbyl and hydrocarbyl groups include straight-chain, branched or cyclic alkyl with 1 to 40, preferably 1 to 25 C-atoms, which is unsubstituted, mono- or polysubstituted by F, Cl, Br, I or CN, and wherein one or more non-adjacent $CH_2$ groups are optionally replaced, in each case independently from one another, by —O—, —S—, —NH—, —NR⁰—, —SiR⁰R⁰⁰—, —CO—, —COO—, —OCO—, —O—CO—O—, —S—CO—, —CO—S—, —SO$_2$—, —CO—NR⁰—, —NR⁰—CO—, —NR⁰—CO—NR⁰⁰—, —CY¹=CY²— or —C≡C— in such a manner that O and/or S atoms are not linked directly to one another, wherein Y¹ and Y² are independently of each other H, F, Cl or CN, and R⁰ and R⁰⁰ are independently of each other H or an optionally substituted aliphatic or aromatic hydrocarbon with 1 to 20 C atoms.

R⁰ and R⁰⁰ are preferably selected from H, straight-chain or branched alkyl with 1 to 12 C atoms or aryl with 6 to 12 C atoms.

—CY¹=CY²— is preferably —CH=CH—, —CF=CF— or —CH=C(CN)—.

Halogen is F, Cl, Br or I.

Preferred alkyl groups include, without limitation, methyl, ethyl, n-propyl, i-propyl, n-butyl, i-butyl, s-butyl, t-butyl, 2-methylbutyl, n-pentyl, s-pentyl, cyclopentyl, n-hexyl, cyclohexyl, 2-ethylhexyl, n-heptyl, cycloheptyl, n-octyl, cyclooctyl, dodecanyl, tetradecyl, hexadecyl, trifluoromethyl, perfluoro-n-butyl, 2,2,2-trifluoroethyl, perfluorooctyl, perfluorohexyl etc.

Preferred alkenyl groups include, without limitation, ethenyl, propenyl, butenyl, pentenyl, cyclopentenyl, hexenyl, cyclohexenyl, heptenyl, cycloheptenyl, octenyl, cyclooctenyl etc.

Preferred alkynyl groups include, without limitation, ethynyl, propynyl, butynyl, pentynyl, hexynyl, octynyl etc.

Preferred alkoxy groups include, without limitation, methoxy, ethoxy, 2-methoxyethoxy, n-propoxy, i-propoxy, n-butoxy, i-butoxy, s-butoxy, t-butoxy, 2-methylbutoxy, n-pentoxy, n-hexoxy, n-heptoxy, n-octoxy etc.

Preferred amino groups include, without limitation, dimethylamino, methylamino, methylphenylamino, phenylamino, etc.

Aryl groups may be mononuclear, i.e. having only one aromatic ring (like for example phenyl or phenylene), or polynuclear, i.e. having two or more aromatic rings which may be fused (like for example napthyl or naphthylene), individually covalently linked (like for example biphenyl), and/or a combination of both fused and individually linked aromatic rings. Preferably the aryl group is an aromatic group which is substantially conjugated over substantially the whole group.

Aryl and heteroaryl preferably denote a mono-, bi- or tricyclic aromatic or heteroaromatic group with up to 25 C atoms that may also comprise condensed rings and is optionally substituted.

Preferred aryl groups include, without limitation, benzene, biphenylene, triphenylene, [1,1':3',1"]terphenyl-2'-ylene, naphthalene, anthracene, binaphthylene, phenanthrene, pyrene, dihydropyrene, chrysene, perylene, tetracene, pentacene, benzpyrene, fluorene, indene, indenofluorene, spirobifluorene, etc.

Preferred heteroaryl groups include, without limitation, 5-membered rings like pyrrole, pyrazole, imidazole, 1,2,3-triazole, 1,2,4-triazole, tetrazole, furan, thiophene, selenophene, oxazole, isoxazole, 1,2-thiazole, 1,3-thiazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 6-membered rings like pyridine, pyridazine, pyrimidine, pyrazine, 1,3,5-triazine, 1,2,4-triazine, 1,2,3-triazine, 1,2,4,5-tetrazine, 1,2,3,4-tetrazine, 1,2,3,5-tetrazine, and fused systems like carbazole, indole, isoindole, indolizine, indazole, benzimidazole, benzotriazole, purine, naphthimidazole, phenanthrimidazole, pyridimidazole, pyrazinimidazole, quinoxalinimidazole, benzoxazole, naphthoxazole, anthroxazole, phenanthroxazole, isoxazole, benzothiazole, benzofuran, isobenzofuran, dibenzofuran, quinoline, isoquinoline, pteridine, benzo-5,6-quinoline, benzo-6,7-quinoline, benzo-7,8-quinoline, benzoisoquinoline, acridine, phenothiazine, phenoxazine, benzopyridazine, benzopyrimidine, quinoxaline, phenazine, naphthyridine, azacarbazole, benzocarboline, phenanthridine, phenanthroline, thieno[2,3b]thiophene, thieno[3,2b]thiophene, dithienothiophene, dithienopyridine, isobenzothiophene, dibenzothiophene, benzothiadiazothiophene, or combinations thereof. The heteroaryl groups may be substituted with alkyl, alkoxy, thioalkyl, fluoro, fluoroalkyl or further aryl or heteroaryl substituents.

Preferred arylalkyl groups include, without limitation, 2-tolyl, 3-tolyl, 4-tolyl, 2,6-dimethylphenyl, 2,6-diethylphenyl, 2,6-di-1-propylphenyl, 2,6-di-t-butylphenyl, o-t-butylphenyl, m-t-butylphenyl, p-t-butylphenyl, 4-phenoxyphenyl, 4-fluorophenyl, 3-carbomethoxyphenyl, 4-carbomethoxyphenyl etc.

Preferred alkylaryl groups include, without limitation, benzyl, ethylphenyl, 2-phenoxyethyl, propylphenyl, diphenylmethyl, triphenylmethyl or naphthalinylmethyl.

Preferred aryloxy groups include, without limitation, phenoxy, naphthoxy, 4-phenylphenoxy, 4-methylphenoxy, biphenyloxy, anthracenyloxy, phenanthrenyloxy etc.

The aryl, heteroaryl, carbyl and hydrocarbyl groups optionally comprise one or more substituents, preferably selected from silyl, sulpho, sulphonyl, formyl, amino, imino, nitrilo, mercapto, cyano, nitro, halogen, $C_{1-12}$alkyl, $C_{6-12}$ aryl, $C_{1-12}$ alkoxy, hydroxy and/or combinations thereof. The optional substituents may comprise all chemically possible combinations in the same group and/or a plurality (preferably two) of the aforementioned groups (for example amino and sulphonyl if directly attached to each other represent a sulphamoyl radical).

Preferred substituents include, without limitation, F, Cl, Br, I, —CN, —NO$_2$, —NCO, —NCS, —OCN, —SCN, —C(=O)NR$^0$R$^{00}$, —C(=O)X$^0$, —C(=O)R$^0$, —NR$^0$R$^{00}$, optionally substituted silyl, aryl with 6 to 40, preferably 6 to 20 C atoms, heteroaryl with 2 to 40, preferably 2 to 20 C atoms, and straight chain or branched alkyl, alkoxy, alkylcarbonyl, alkoxy-carbonyl, alkylcarbonlyoxy or alkoxycarbonyloxy with 1 to 20, preferably 1 to 12 C atoms, wherein one or more H atoms are optionally replaced by F or Cl, wherein R$^0$ and R$^{00}$ are as defined above and X$^0$ is halogen.

Especially preferred substituents are selected from alkyl, alkoxy, alkenyl, oxaalkyl, thioalkyl, fluoroalkyl and fluoroalkoxy groups as defined for the preferred groups R$^{1,2}$ below.

If R$^{1,2}$ is an alkyl or alkoxy radical, i.e. where the terminal CH$_2$ group is replaced by —O—, this may be straight-chain or branched. It is preferably straight-chain, has 2 to 8 carbon atoms and accordingly is preferably ethyl, propyl, butyl, pentyl, hexyl, heptyl, octyl, ethoxy, propoxy, butoxy, pentoxy, hexyloxy, heptoxy, or octoxy, furthermore methyl, nonyl, decyl, undecyl, dodecyl, tridecyl, tetradecyl, pentadecyl, nonoxy, decoxy, undecoxy, dodecoxy, tridecoxy or tetradecoxy, for example. Especially preferred are n-hexyl and n-dodecyl.

If R$^{1,2}$ is an alkyl group wherein one or more CH$_2$ groups are replaced by —CH=CH—, this may be straight-chain or branched. It is preferably straight-chain, has 2 to 12 C-atoms and accordingly is preferably vinyl, prop-1-, or prop-2-enyl, but-1-, 2- or but-3-enyl, pent-1-, 2-, 3- or pent-4-enyl, hex-1-, 2-, 3-, 4- or hex-5-enyl, hept-1-, 2-, 3-, 4-, 5- or hept-6-enyl, oct-1-, 2-, 3-, 4-, 5-, 6- or oct-7-enyl, non-1-, 2-, 3-, 4-, 5-, 6-, 7- or non-8-enyl, dec-1-, 2-, 3-, 4-, 5-, 6-, 7-, 8- or dec-9-enyl, undec-1-, 2-, 3-, 4-, 5-, 6-, 7-, 8-, 9- or undec-10-enyl, dodec-1-, 2-, 3-, 4-, 5-, 6-, 7-, 8-, -9, -10 or undec-11-enyl. The alkenyl group may comprise C=C-bonds with E- or Z-configuration or a mixture thereof.

If R$^{1,2}$ is oxaalkyl, i.e. where one CH$_2$ group is replaced by —O—, is preferably straight-chain 2-oxapropyl (=methoxymethyl), 2-(=ethoxymethyl) or 3-oxabutyl (=2-methoxyethyl), 2-, 3-, or 4-oxapentyl, 2-, 3-, 4-, or 5-oxahexyl, 2-, 3-, 4-, 5-, or 6-oxaheptyl, 2-, 3-, 4-, 5-, 6- or 7-oxaoctyl, 2-, 3-, 4-, 5-, 6-, 7- or 8-oxanonyl or 2-, 3-, 4-, 5-, 6-, 7-, 8- or 9-oxadecyl, for example.

If R$^{1,2}$ is thioalkyl, i.e where one CH$_2$ group is replaced by —S—, is preferably straight-chain thiomethyl (—SCH$_3$), 1-thioethyl (—SCH$_2$CH$_3$), 1-thiopropyl (=—SCH$_2$CH$_2$CH$_3$), 1-(thiobutyl), 1-(thiopentyl), 1-(thiohexyl), 1-(thioheptyl), 1-(thiooctyl), 1-(thiononyl), 1-(thiodecyl), 1-(thioundecyl) or 1-(thiododecyl), wherein preferably the CH$_2$ group adjacent to the sp$^2$ hybridised vinyl carbon atom is replaced.

If R$^{1,2}$ is fluoroalkyl or fluoroalkoxy, it is preferably a straight-chain group (O)C$_i$F$_{2i+1}$, wherein i is an integer from 1 to 15, in particular CF$_3$, C$_2$F$_5$, C$_3$F$_7$, C$_4$F$_9$, C$_5$F$_{11}$, C$_6$F$_{13}$, C$_7$F$_{15}$ or C$_8$F$_{17}$, very preferably C$_6$F$_{13}$, or the corresponding fluoroalkoxy group.

The polymers may also be substituted with a polymerisable or reactive group, which is optionally protected during the process of forming the polymer. Particular preferred polymers of this type are those of formula I wherein R$^1$ denotes P-Sp. These polymers are particularly useful as semiconductors or charge transport materials, as they can be crosslinked via the groups P, for example by polymerisation in situ, during or after processing the polymer into a thin film for a semiconductor component, to yield crosslinked polymer films with high charge carrier mobility and high thermal, mechanical and chemical stability.

Preferably the polymerisable or reactive group P is selected from CH$_2$=CW$^1$—COO—, CH$_2$=CW$^1$—CO—,

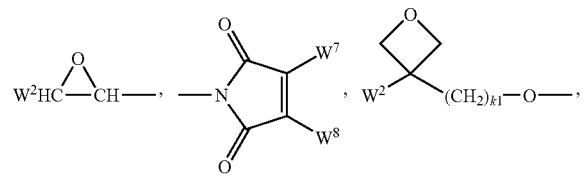

CH$_2$=CW$^2$—(O)$_{k1}$—, CH$_3$—CH=CH—O—, (CH$_2$=CH)$_2$CH—OCO—, (CH$_2$=CH—CH$_2$)$_2$CH—OCO—, (CH$_2$=CH)$_2$CH—O—, (CH$_2$=CH—CH$_2$)$_2$N—, (CH$_2$=CH—CH$_2$)$_2$N—CO—, HO—CW$^2$W$^3$—, HS—CW$^2$W$^3$—, HW$^2$N—, HO—CW$^2$W$^3$—NH—, CH$_2$=CW$^1$—CO—NH—, CH$_2$=CH—(COO)$_{k1}$-Phe-(O)$_{k2}$—, CH$_2$=CH—(CO)$_{k1}$-Phe-(O)$_{k2}$—, Phe-CH=CH—, HOOC—, OCN—, and W$^4$W$^5$W$^6$Si—, with W$^1$ being H, F, Cl, CN, CF$_3$, phenyl or alkyl with 1 to 5 C-atoms, in particular H, C$_1$ or CH$_3$, W$^2$ and W$^3$ being independently of each other H or alkyl with 1 to 5 C-atoms, in particular H, methyl, ethyl or n-propyl, W$^4$, W$^5$ and W$^6$ being independently of each other Cl, oxaalkyl or oxacarbonylalkyl with 1 to 5 C-atoms, W$^7$ and W$^8$ being independently of each other H, Cl or alkyl with 1 to 5 C-atoms, Phe being 1,4-phenylene that is optionally substituted by one or more groups L as defined above, and k$_1$ and k$_2$ being independently of each other 0 or 1.

Alternatively P is a protected derivative of these groups which is non-reactive under the conditions described for the process according to the present invention. Suitable protective groups are known to the ordinary expert and described in the literature, for example in Green, "Protective Groups in Organic Synthesis", John Wiley and Sons, New York (1981), like for example acetals or ketals.

Especially preferred groups P are $CH_2=CH-COO-$, $CH_2=C(CH_3)-COO-$, $CH_2=CH-$, $CH_2=CH-O-$, $(CH_2=CH)_2CH-OCO-$, $(CH_2=CH)_2CH-O-$,

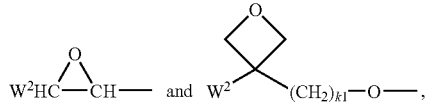

or protected derivatives thereof.

Polymerisation of group P can be carried out according to methods that are known to the ordinary expert and described in the literature, for example in D. J. Broer; G. Challa; G. N. Mol, *Macromol. Chem.*, 1991, 192, 59.

The term "spacer group" is known in prior art and suitable spacer groups Sp are known to the ordinary expert (see e.g. Pure Appl. Chem. 73(5), 888 (2001). The spacer group Sp is preferably of formula Sp'-X', such that P-Sp- is P-Sp'-X'—, wherein Sp' is alkylene with up to 30 C atoms which is unsubstituted or mono- or polysubstituted by F, Cl, Br, I or CN, it being also possible for one or more non-adjacent $CH_2$ groups to be replaced, in each case independently from one another, by $-O-$, $-S-$, $-NH-$, $-NR^0-$, $-SiR^0R^{00}-$, $-CO-$, $-COO-$, $-OCO-$, $-OCO-O-$, $-S-CO-$, $-CO-S-$, $-CH=CH-$ or $-C\equiv C-$ in such a manner that O and/or S atoms are not linked directly to one another, $X^1$ is $-O-$, $-S-$, $-CO-$, $-COO-$, $-OCO-$, $-O-COO-$, $-CO-NR^0-$, $-NR^0-CO-$, $-NR^0-CO-NR^{00}-$, $-OCH_2-$, $-CH_2O-$, $-SCH_2-$, $-CH_2S-$, $-CF_2O-$, $-OCF_2-$, $-CF_2S-$, $-SCF_2-$, $-CF_2CH_2-$, $-CH_2CF_2-$, $-CF_2CF_2-$, $-CH=N-$, $-N=CH-$, $-N=N-$, $-CH=CR^0-$, $-CY^1=CY^2-$, $-C\equiv C-$, $-CH=CH-COO-$, $-OCO-CH=CH-$ or a single bond, $R^0$ and $R^{00}$ are independently of each other H or alkyl with 1 to 12 C-atoms, and $Y^1$ and $Y^2$ are independently of each other H, F, Cl or CN.

X' is preferably $-O-$, $-S-$, $-OCH_2-$, $-CH_2O-$, $-SCH_2-$, $-CH_2S-$, $-CF_2O-$, $-OCF_2-$, $-CF_2S-$, $-SCF_2-$, $-CH_2CH_2-$, $-CF_2CH_2-$, $-CH_2CF_2-$, $-CF_2CF_2-$, $-CH=N-$, $-N=CH-$, $-N=N-$, $-CH=CR^0-$, $-CY^1=CY^2-$, $-C\equiv C-$ or a single bond, in particular $-O-$, $-S-$, $-C\equiv C-$, $-CY^1=CY^2-$ or a single bond. In another preferred embodiment X' is a group that is able to form a conjugated system, such as $-C\equiv C-$ or $-CY^1=CY^2-$, or a single bond.

Typical groups Sp' are, for example, $-(CH_2)_p-$, $-(CH_2CH_2O)_q-CH_2CH_2-$, $-CH_2CH_2-S-CH_2CH_2-$ or $-CH_2CH_2-NH-CH_2CH_2-$ or $-(SiR^0R^{00}-O)_p-$, with p being an integer from 2 to 12, q being an integer from 1 to 3 and $R^0$ and $R^{00}$ having the meanings given above.

Preferred groups Sp' are ethylene, propylene, butylene, pentylene, hexylene, heptylene, octylene, nonylene, decylene, undecylene, dodecylene, octadecylene, ethyleneoxyethylene, methyleneoxybutylene, ethylene-thioethylene, ethylene-N-methyl-iminoethylene, 1-methylalkylene, ethenylene, propenylene and butenylene for example.

Especially preferred are polymers of formula II

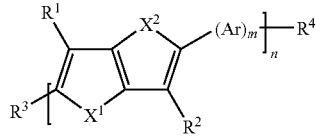

wherein $R^{1,2}$, $X^{1,2}$, Ar, m and n have the meanings given above, and $R^3$ and $R^4$ do independently of each other have one of the meanings of $R^1$ or denote $-CH_2Cl$, $-CHO$, $-CH=CH_2$, $-SiR'R''R'''$, $-SnR'R''R'''$, $-BR'R''$, $-B(OR')(OR'')$, $-B(OH)_2$, or P-Sp, wherein P and Sp are as defined above, and R', R'' and R''' have independently of each other one of the meanings of $R^0$ given above and R' and R'' may also form a ring together with the hetero atom to which the are attached.

Especially preferred are polymers of formula I and II wherein $X^1$ is Se and $X^2$ is S,
$X^1$ is S and $X^2$ is Se,
$X^1$ and $X^2$ are Se,
m is 0,
m is 1 or 2,
Ar is $-CH=CH-$ or $-C\equiv C-$, especially preferably with m being 1,
Ar is aryl or heteroaryl, preferably selected from selenophene-2,5-diyl, thiophene-2,5-diyl, thieno[3,2-b]thiophene-2,5-diyl, thieno[2,3-b]thiophene-2,5-diyl, selenopheno[3,2-b]selenophene-2,5-diyl, selenopheno[2,3-b]selenophene-2,5-diyl, selenopheno[3,2-b]thiophene-2,5-diyl, selenopheno[2,3-b]thiophene-2,5-diyl, 1,4-phenylene, pyridine-2,5-diyl, pyrimidine-2,5-diyl, p-p'-biphenyl, naphthalene-2,6-diyl, benzo[1,2-b:4,5-b']dithiophene-2,6-diyl, 2,2-dithiophene, 2,2-diselenophene, thiazole and oxazole, all of which are unsubstituted, mono- or polysubstituted, preferably with $R^1$ as defined above, especially preferably with m being 1 or 2,
$R^1$ and/or $R^2$ is H,
$R^{1,2}$ are selected from, preferably straight-chain, $C_1$-$C_{20}$-alkyl, $C_1$-$C_{20}$-alkoxy, $C_2$-$C_{20}$-alkenyl, $C_2$-$C_{20}$-alkynyl, $C_1$-$C_{20}$-thioalkyl, $C_1$-$C_{20}$-silyl, $C_1$-$C_{20}$-ester, $C_1$-$C_{20}$-amino, $C_1$-$C_{20}$-fluoroalkyl, and optionally substituted aryl or heteroaryl, very preferably $C_1$-$C_{20}$-alkyl or $C_1$-$C_{20}$-fluoroalkyl,
$R^3$ and $R^4$ are selected from H, halogen, $-CH_2Cl$, $-CHO$, $-CH=CH_2$, $-SiR'R''R'''$, $-SnR'R''R'''$, $-BR'R''$, $-B(OR')(OR'')$, $-B(OH)_2$, P-Sp, $C_1$-$C_{20}$-alkyl, $C_1$-$C_{20}$-alkoxy, $C_2$-$C_{20}$-alkenyl, $C_1$-$C_{20}$-fluoroalkyl and optionally substituted aryl or heteroaryl,
at least one, preferably one or two of $R^{1-4}$ denote P-Sp-,
n is an integer from n is an integer from 2 to 5,000, preferably from 10 to 5,000, very preferably from 100 to 1000,
the molecular weight (Mw) is from 5,000 to 300,000, in particular from 20,000 to 200,000.

Especially preferred are polymers of the following formulae

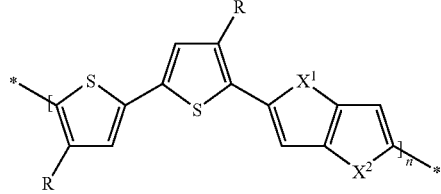

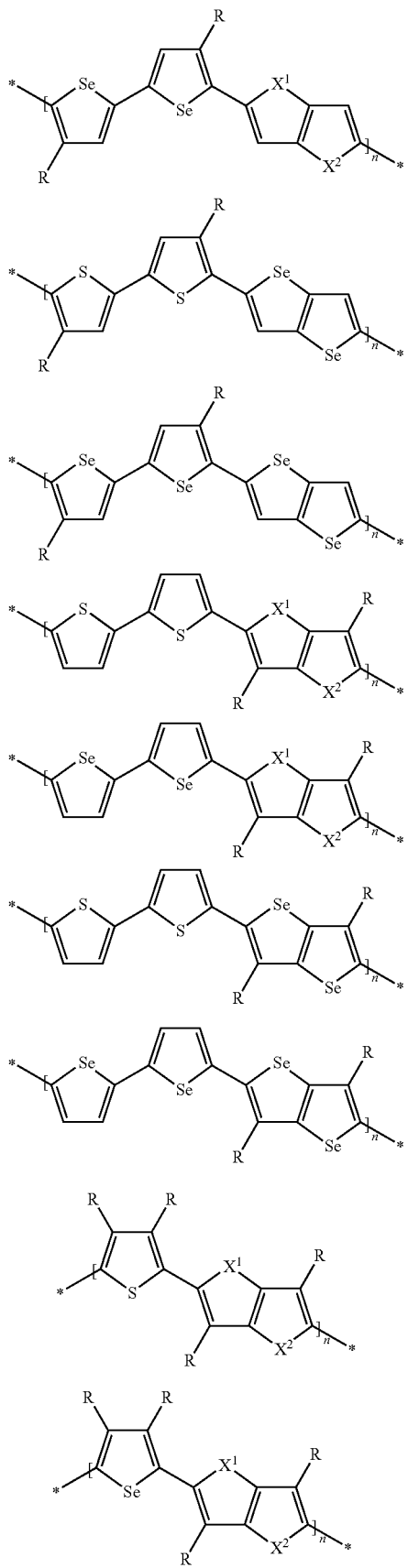
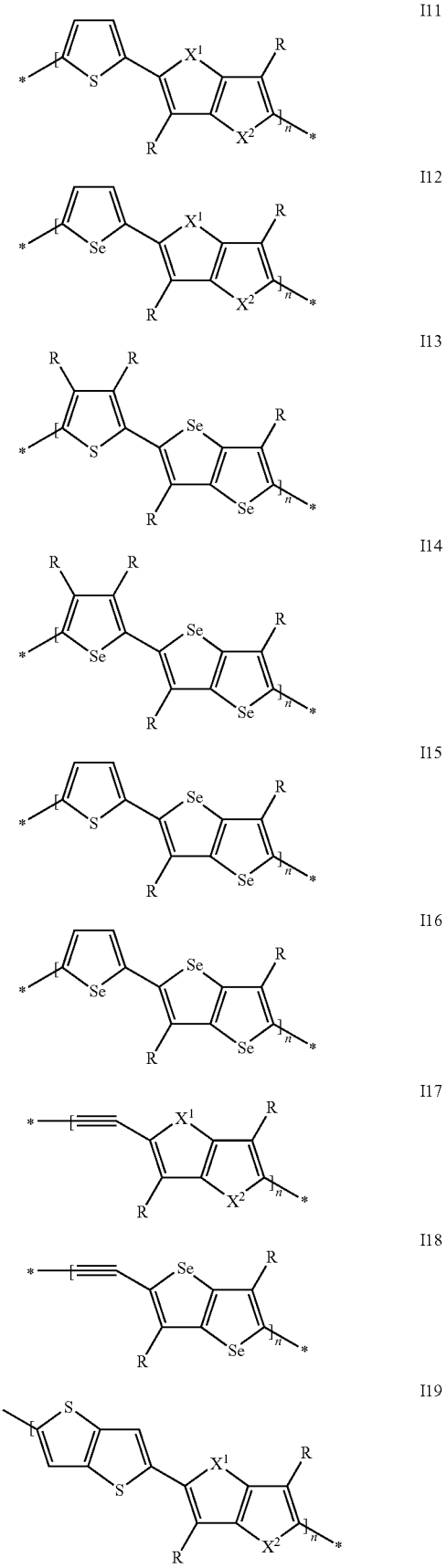

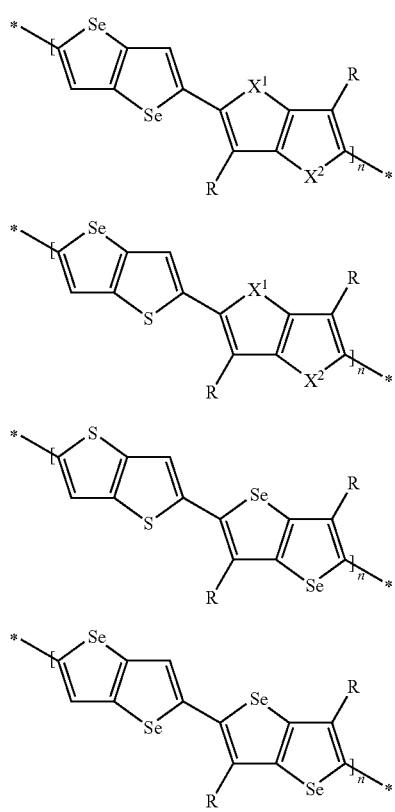

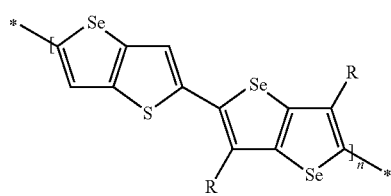

wherein
independently of each other in each occurring unit one of $X^1$ and $X^2$ is S and the other is Se,
n is as defined above, and
R has in case of multiple occurrence independently of one another denotes H or has one of the meanings of $R^1$ given above, and is preferably selected from, preferably straight-chain, $C_1$-$C_{20}$-alkyl, $C_1$-$C_{20}$-alkoxy, $C_2$-$C_{20}$-alkenyl, $C_2$-$C_{20}$-alkynyl, $C_1$-$C_{20}$-thioalkyl, $C_1$-$C_{20}$-silyl, $C_1$-$C_{20}$-ester, $C_1$-$C_{20}$-amino, $C_1$-$C_{20}$-fluoroalkyl, and optionally substituted aryl or heteroaryl, very preferably $C_1$-$C_{20}$-alkyl or $C_1$-$C_{20}$-fluoroalkyl.

Further preferred are polymers of formula II wherein the recurring units are selected of preferred formulae I1 to I24 as shown above.

Due to the synthesis method described below, the polymers of formula I comprising selenopheno[3,2-b]thiophene groups, like those of formula I1, I2, I5, I6, I9, I10, I11, I12, I17, I19, I20 and I21 will be random with respect to the orientation of the selenothiophene such, for example in case of a polymer of formula Ia both structures Ia1 and Ia2 as shown below will exist:

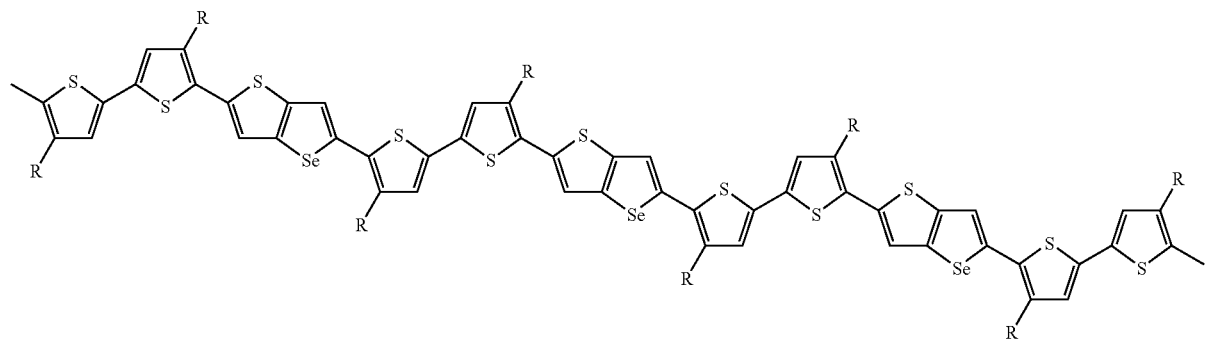

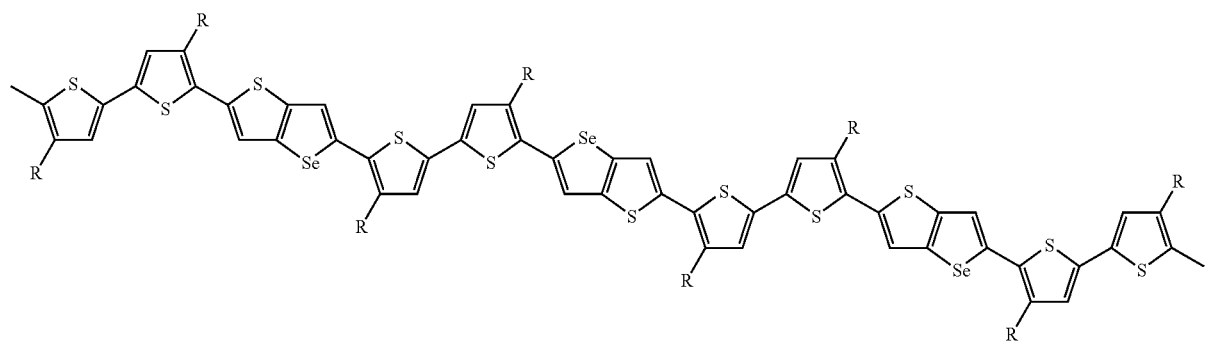

The polymers of the present invention can be synthesized according to or in analogy to methods that are known to the skilled person and are described in the literature. Other methods of preparation can be taken from the examples. Some preferred methods are described below (wherein X is S or Se, R has one of the meanings of R[1], and Ar denotes an aryl group as defined above).

The synthesis of selenopheno[3,2-b]thiophene and selenopheno[3,2-b]selenophene polymers is exemplarily shown in Scheme 1.

Scheme 1:

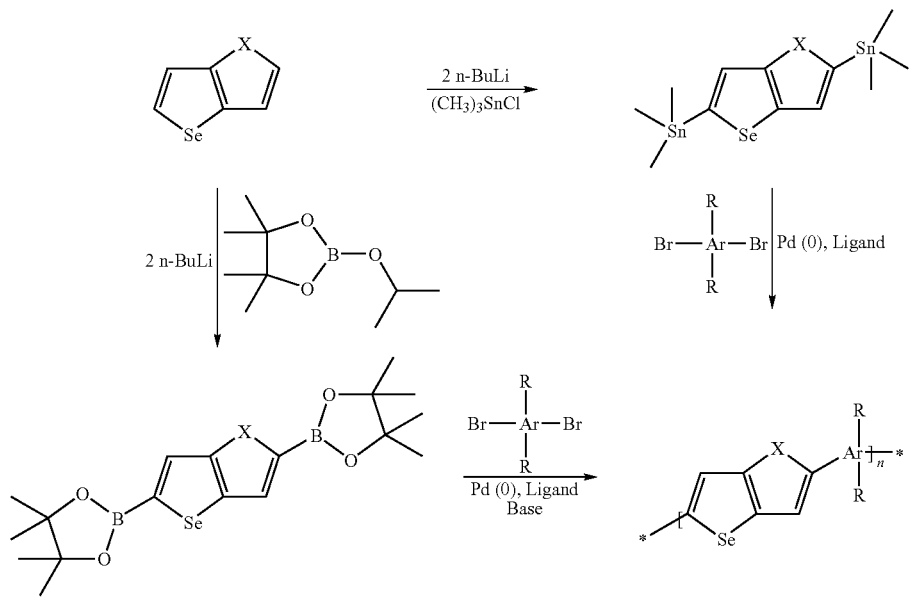

Scheme 2

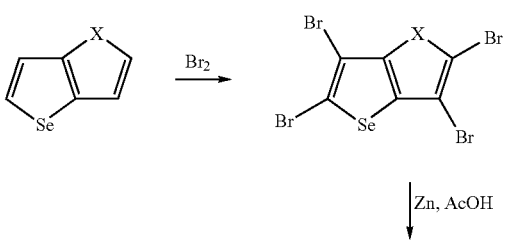

The polymers are synthesised by a co-polymerisation between either the boronic ester or the organotin reagent of selenopheno[3,2-b]thiophene and selenopheno[3,2-b]selenophene with an aromatic dibromide or diiodide. The synthesis of the key selenopheno[3,2-b]thiophene and selenopheno[3,2-b]selenophene monomers has previously been reported (see for example Shuji, Y., Jyoji, K., Takashi, T. Heterocycles 1997, 45 1891-1894; Litvinov, V. P. et al J. Prak. Chem. 1973 315, 850-864). The conversion of these monomers to the organometallic intermediates is readily achieved by lithiation with 2 equivalents of n-BuLi to afford the dilithiated intermediate in situ. This is then reacted with either a trialkyl tin chloride to afford the organotin intermediate, or with a boronic ester such as 2-isopropoxy-4,4,5,5-tetramethyl-1,3,2-dioxaborolane to afford the boronic ester. Polymerisation of the organotin intermediate with an appropriate aromatic dibromide or diiodide in the presence of a palladium catalyst and a phosphine ligand affords the polymer. Similarly the boronic ester is polymerised by reaction with an appropriate aromatic dibromide or diiodide in the presence of a palladium catalyst, phosphine ligand and base.

The preparation of fused selenopheno[3,2-b]thiophene and selenopheno[3,2-b]selenophene polymers containing solubilising sidechains on the fused ring is exemplarily shown in Scheme 2.

-continued

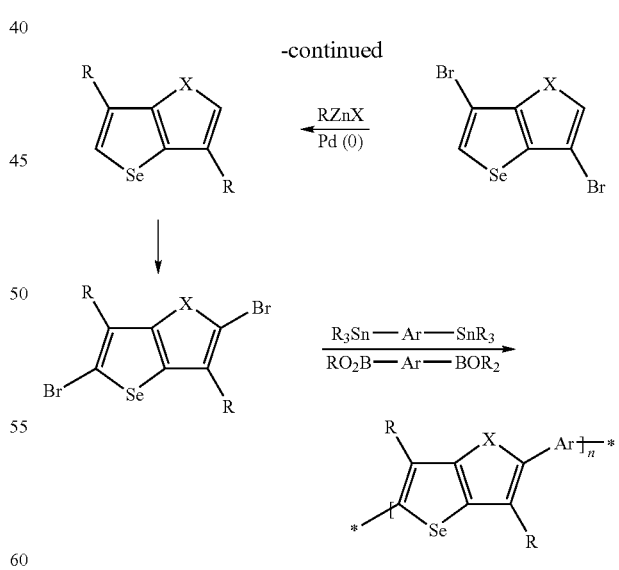

The unsubstituted fused selenopheno[3,2-b]thiophene and selenopheno[3,2-b]selenophene is tetrabrominated by treatment with four equivalent of bromine or N-bromosuccinimide. Subsequent reduction of the bromines in the 2,5-position by treatment with zinc in acetic acid, afforded the 3,6-dibromo intermediate. Treatment of this with alkylzinc halides in the presence of a palladium catalyst affords the 3,6-dialkyl intermediates, which are brominated in the free 2,5-positions by treatment with N-bromosuccinimide.

The novel methods of preparing polymers as described above and below are another aspect of the invention.

The polymers according to the present invention are useful as charge transport, semiconducting, electrically conducting, photoconducting or light emitting materials in optical, electrooptical, electronic, electroluminescent or photoluminescent components or devices.

Especially preferred devices are OFETs, TFTS, ICs, logic circuits, capacitors, RFID tags, OLEDs, OLETs, OPVs, solar cells, laser diodes, photoconductors, photodetectors, electrophotographic devices, electrophotographic recording devices, organic memory devices, sensor devices, charge injection layers, Schottky diodes, planarising layers, antistatic films, conducting substrates and conducting patterns. In these devices, the polymers of the present invention are typically applied as thin layers or films.

OFETs where an organic semiconducting (OSC) material is arranged as a thin film between a gate dielectric and a drain and a source electrode, are generally known, and are described for example in U.S. Pat. No. 5,892,244, WO 00/79617, U.S. Pat. No. 5,998,804, and in the references cited in the background section. Due to the advantages, like low cost production using the solubility properties of the polymers according to the invention and thus the processability of large surfaces, preferred applications of these FETs are such as integrated circuitry, TFT displays and security applications.

The polymers according to the present invention can also be used in polymer blends, for example together with other polymers having charge-transport, semiconducting, electrically conducting, photoconducting and/or light emitting semiconducting properties, or for example with polymers having hole blocking or electron blocking properties for use as interlayers or charge blocking layers in OLED devices. Thus, another aspect of the invention relates to a polymer blend comprising one or more polymers according to the present invention and one or more further polymers having one or more of the above-mentioned properties. These blends can be prepared by conventional methods that are described in prior art and known to the skilled person. Typically the polymers are mixed with each other or dissolved in suitable solvents and the solutions combined.

Another aspect of the invention relates to a formulation comprising one or more polymers or polymer blends as described above and below and one or more organic solvents.

Examples of suitable and preferred organic solvents include, without limitation, dichloromethane, trichloromethane, monochlorobenzene, o-dichlorobenzene, tetrahydrofuran, anisole, morpholine, toluene, o-xylene, m-xylene, p-xylene, 1,4-dioxane, acetone, methylethylketone, 1,2-dichloroethane, 1,1,1-trichloroethane, 1,1,2,2-tetrachloroethane, ethyl acetate, n-butyl acetate, dimethylformamide, dimethylacetamide, dimethylsulfoxide, tetraline, decaline, indane, methyl benzoate, ethyl benzoate, mesitylene and/or mixtures thereof.

The concentration of the polymers in the solution is preferably 0.1 to 10% by weight, more preferably 0.5 to 5% by weight. Optionally, the solution also comprises one or more binders to adjust the rheological properties, as described for example in WO 2005/055248 A1.

After the appropriate mixing and ageing, solutions are evaluated as one of the following categories: complete solution, borderline solution or insoluble. The contour line is drawn to outline the solubility parameter-hydrogen bonding limits dividing solubility and insolubility. 'Complete' solvents falling within the solubility area can be chosen from literature values such as published in "Crowley, J. D., Teague, G. S. Jr and Lowe, J. W. Jr., Journal of Paint Technology, 38, No 496, 296 (1966)". Solvent blends may also be used and can be identified as described in "Solvents, W. H. Ellis, Federation of Societies for Coatings Technology, p 9-10, 1986". Such a procedure may lead to a blend of 'non' solvents that will dissolve both the polymers of the present invention, although it is desirable to have at least one true solvent in a blend.

The polymers according to the present invention can also be used in patterned OSC layers in the devices as described above and below. For applications in modern microelectronics it is generally desirable to generate small structures or patterns to reduce cost (more devices/unit area), and power consumption. Patterning of thin layers comprising a polymer according to the present invention can be carried out for example by photolithography, electron beam lithography or laser patterning.

For use as thin layers in electronic or electrooptical devices the polymers, polymer blends or formulations of the present invention may be deposited by any suitable method. Liquid coating of devices is more desirable than vacuum deposition techniques. Solution deposition methods are especially preferred. The formulations of the present invention enable the use of a number of liquid coating techniques. Preferred deposition techniques include, without limitation, dip coating, spin coating, ink jet printing, letter-press printing, screen printing, doctor blade coating, roller printing, reverse-roller printing, offset lithography printing, flexographic printing, web printing, spray coating, brush coating or pad printing. Ink-jet printing is particularly preferred as it allows high resolution layers and devices to be prepared.

Selected formulations of the present invention may be applied to prefabricated device substrates by ink jet printing or microdispensing. Preferably industrial piezoelectric print heads such as but not limited to those supplied by Aprion, Hitachi-Koki, InkJet Technology, On Target Technology, Picojet, Spectra, Trident, Xaar may be used to apply the organic semiconductor layer to a substrate. Additionally semi-industrial heads such as those manufactured by Brother, Epson, Konica, Seiko Instruments Toshiba TEC or single nozzle microdispensers such as those produced by Microdrop and Microfab may be used.

In order to be applied by ink jet printing or microdispensing, the polymers should be first dissolved in a suitable solvent. Solvents must fulfil the requirements stated above and must not have any detrimental effect on the chosen print head. Additionally, solvents should have boiling points>100° C., preferably >140° C. and more preferably >150° C. in order to prevent operability problems caused by the solution drying out inside the print head. Apart from the solvents methoned above, suitable solvents include substituted and non-substituted xylene derivatives, di-$C_{1-2}$-alkyl formamide, substituted and non-substituted anisoles and other phenol-ether derivatives, substituted heterocycles such as substituted pyridines, pyrazines, pyrimidines, pyrrolidinones, substituted and non-substituted N,N-di-$C_{1-2}$-alkylanilines and other fluorinated or chlorinated aromatics.

A preferred solvent for depositing a polymer according to the present invention by ink jet printing comprises a benzene derivative which has a benzene ring substituted by one or more substituents wherein the total number of carbon atoms among the one or more substituents is at least three. For example, the benzene derivative may be substituted with a propyl group or three methyl groups, in either case there being at least three carbon atoms in total. Such a solvent enables an ink jet fluid to be formed comprising the solvent with the polymer, which reduces or prevents clogging of the jets and separation of the components during spraying. The solvent(s) may include those selected from the following list of examples: dodecylbenzene, 1-methyl-4-tert-butylbenzene, terpineol limonene, isodurene, terpinolene, cymene, diethylbenzene. The solvent may be a solvent mixture, that is a combination of two or more solvents, each solvent preferably having a boiling point>100° C., more preferably >140° C. Such solvent(s) also enhance film formation in the layer deposited and reduce defects in the layer.

The ink jet fluid (that is mixture of solvent, binder and semiconducting compound) preferably has a viscosity at 20° C. of 1-100 mPa·s, more preferably 1-50 mPa·s and most preferably 1-30 mPa·s.

The polymers or formulations according to the present invention can additionally comprise one or more further components like for example surface-active compounds, lubricating agents, wetting agents, dispersing agents, hydrophobing agents, adhesive agents, flow improvers, defoaming agents, deaerators, diluents which may be reactive or non-reactive, auxiliaries, colourants, dyes or pigments, sensitizers, stabilizers, nanoparticles or inhibitors.

An OFET device according to the present invention preferably comprises:
a source electrode,
a drain electrode,
a gate electrode,
an organic semiconducting (OSC) layer,
one or more gate insulator layers,
optionally a substrate,
wherein the OSC layer comprises one or more polymers according to the present invention.

The gate, source and drain electrodes and the insulating and semiconducting layer in the OFET device may be arranged in any sequence, provided that the source and drain electrode are separated from the gate electrode by the insulating layer, the gate electrode and the semiconductor layer both contact the insulating layer, and the source electrode and the drain electrode both contact the semiconducting layer. The OFET device can be a top gate device or a bottom gate device. Suitable structures and manufacturing methods of an OFET device are known to the skilled in the art and are described in the literature, for example in WO 03/052841.

An OPV device according to the present invention preferably comprises:
a low work function electrode (for example Aluminum),
a high work function electrode (for example ITO), one of which is transparent,
a bilayer of consisting of a hole transporting and an electron transporting material; the bilayer can exist as two distinct layers, or a blended mixture (see for example Coakley, K. M. and McGehee, M. D. *Chem. Mater.* 2004, 16, 4533),
an optional conducting polymer layer (such as for example PEDOT:PSS) to modify the work function of the high work function electrode to provide an ohmic contact for the hole,
an optional coating on the high workfunction electrode (such as LiF) to provide an ohmic contact for electrons.

The hole transporting polymer in the blend exists of one of the polymers of the present invention. The electron transporting material can be an inorganic material such as zinc oxide or cadmium selenide, or an organic material such as a fullerene derivate (for example PCBM, [(6,6)-phenyl C61-butyric acid methyl ester] or a polymer see for example Coakley, K. M. and McGehee, M. D. *Chem. Mater.* 2004, 16, 4533). If the bilayer is a blend an optional annealing step may be necessary to optimize device performance.

In security applications, OFETs and other devices with semiconducting materials according to the present invention, like transistors or diodes, can be used for RFID tags or security markings to authenticate and prevent counterfeiting of documents of value like banknotes, credit cards or ID cards, national ID documents, licenses or any product with monetary value, like stamps, tickets, shares, cheques etc.

Alternatively, the materials according to the invention can be used in organic light emitting devices or diodes (OLEDs), e.g., in display applications or as backlight of e.g. liquid crystal displays. Common OLEDs are realized using multilayer structures. An emission layer is generally sandwiched between one or more electron-transport and/or hole-transport layers. By applying an electric voltage electrons and holes as charge carriers move towards the emission layer where their recombination leads to the excitation and hence luminescence of the lumophor units contained in the emission layer. The inventive compounds, materials and films may be employed in one or more of the charge transport layers and/or in the emission layer, corresponding to their electrical and/or optical properties. Furthermore their use within the emission layer is especially advantageous, if the compounds, materials and films according to the invention show electroluminescent properties themselves or comprise electroluminescent groups or compounds. The selection, characterization as well as the processing of suitable monomeric, oligomeric and polymeric compounds or materials for the use in OLEDs is generally known by a person skilled in the art, see, e.g., Meerholz, Synthetic Materials, 111-112, 2000, 31-34, Alcala, J. Appl. Phys., 88, 2000, 7124-7128 and the literature cited therein.

According to another use, the materials according to the present invention, especially those which show photoluminescent properties, may be employed as materials of light sources, e.g., of display devices such as described in EP 0 889 350 A1 or by C. Weder et al., Science, 279, 1998, 835-837.

A further aspect of the invention relates to both the oxidised and reduced form of the polymers according to this invention. Either loss or gain of electrons results in formation of a highly delocalised ionic form, which is of high conductivity. This can occur on exposure to common dopants. Suitable dopants and methods of doping are known to those skilled in the art, e.g. from EP 0 528 662, U.S. Pat. No. 5,198,153 or WO 96/21659.

The doping process typically implies treatment of the semiconductor material with an oxidating or reducing agent in a redox reaction to form delocalised ionic centres in the material, with the corresponding counterions derived from the applied dopants. Suitable doping methods comprise for example exposure to a doping vapor in the atmospheric pressure or at a reduced pressure, electrochemical doping in a solution containing a dopant, bringing a dopant into contact with the semiconductor material to be thermally diffused, and ion-implantation of the dopant into the semiconductor material.

When electrons are used as carriers, suitable dopants are for example halogens (e.g., $I_2$, $Cl_2$, $Br_2$, ICl, $ICl_3$, IBr and IF), Lewis acids (e.g., $PF_5$, $AsF_5$, $SbF_5$, $BF_3$, $BCl_3$, $SbCl_5$, $BBr_3$ and $SO_3$), protonic acids, organic acids, or amino acids (e.g., HF, HCl, $HNO_3$, $H_2SO_4$, $HClO_4$, $FSO_3H$ and $ClSO_3H$), transition metal compounds (e.g., $FeCl_3$, FeOCl, $Fe(ClO_4)_3$, $Fe(4-CH_3C_6H_4SO_3)_3$, $TiCl_4$, $ZrCl_4$, $HfCl_4$, $NbF_5$, $NbCl_5$, $TaCl_5$, $MoF_5$, $MOCl_5$, $WF_5$, $WCl_6$, $UF_6$ and $LnCl_3$ (wherein Ln is a lanthanoid), anions (e.g., $Cl^-$, $Br^-$, $I^-$, $I_3^-$, $HSO_4^-$, $SO_4^{2-}$, $NO_3^-$, $ClO_4^-$, $BF_4^-$, $PF_6^-$, $AsF_6^-$, $SbF_6^-$, FeCl$_4^-$, Fe(CN)$_6^{3-}$, and anions of various sulfonic acids, such as aryl-SO$_3^-$). When holes are used as carriers, examples of dopants are cations (e.g., H$^+$, Li$^+$, Na$^+$, K$^+$, Rb$^+$ and Cs$^+$), alkali metals (e.g., Li, Na, K, Rb, and Cs), alkaline-earth metals (e.g., Ca, Sr, and Ba), O$_2$, XeOF$_4$, (NO$_2^+$) (SbF$_6^-$), (NO$_2^+$) (SbCl$_6^-$), (NO$_2^+$) (BF$_4^-$), AgClO$_4$, H$_2$IrCl$_6$, La(NO$_3$)$_3$.6H$_2$O, FSO$_2$OOSO$_2$F, Eu, acetylcholine, R$_4$N$^+$, (R is an alkyl group), R$_4$P$^+$ (R is an alkyl group), R$_6$As$^+$ (R is an alkyl group), and R$_3$S$^+$ (R is an alkyl group).

The conducting form of the polymers of the present invention can be used as an organic "metal" in applications including, but not limited to, charge injection layers and ITO planarising layers in OLED applications, films for flat panel displays and touch screens, antistatic films, printed conductive substrates, patterns or tracts in electronic applications such as printed circuit boards and condensers.

According to another use, the materials according to the present invention can be used alone or together with other materials in or as alignment layers in LCD or OLED devices, as described for example in US 2003/0021913. The use of charge transport compounds according to the present invention can increase the electrical conductivity of the alignment layer. When used in an LCD, this increased electrical conductivity can reduce adverse residual dc effects in the switchable LCD cell and suppress image sticking or, for example in ferroelectric LCDs, reduce the residual charge produced by the switching of the spontaneous polarisation charge of the ferroelectric LCs. When used in an OLED device comprising a light emitting material provided onto the alignment layer, this increased electrical conductivity can enhance the electroluminescence of the light emitting material. The compounds or materials according to the present invention having mesogenic or liquid crystalline properties can form oriented anisotropic films as described above, which are especially useful as alignment layers to induce or enhance alignment in a liquid crystal medium provided onto said anisotropic film. The materials according to the present invention may also be combined with photoisomerisable compounds and/or chromophores for use in or as photoalignment layers, as described in US 2003/0021913.

According to another use the materials according to the present invention, especially their water-soluble derivatives (for example with polar or ionic side groups) or ionically doped forms, can be employed as chemical sensors or materials for detecting and discriminating DNA sequences. Such uses are described for example in L. Chen, D. W. McBranch, H. Wang, R. Helgeson, F. Wudl and D. G. Whitten, Proc. Natl. Acad. Sci. U.S.A. 1999, 96, 12287; D. Wang, X. Gong, P. S. Heeger, F. Rininsland, G. C. Bazan and A. J. Heeger, Proc. Natl. Acad. Sci. U.S.A. 2002, 99, 49; N. DiCesare, M. R. Pinot, K. S. Schanze and J. R. Lakowicz, Langmuir 2002, 18, 7785; D. T. McQuade, A. E. Pullen, T. M. Swager, Chem. Rev. 2000, 100, 2537.

Unless the context clearly indicates otherwise, as used herein plural forms of the terms herein are to be construed as including the singular form and vice versa.

Throughout the description and claims of this specification, the words "comprise" and "contain" and variations of the words, for example "comprising" and "comprises", mean "including but not limited to", and are not intended to (and do not) exclude other components.

It will be appreciated that variations to the foregoing embodiments of the invention can be made while still falling within the scope of the invention. Each feature disclosed in this specification, unless stated otherwise, may be replaced by alternative features serving the same, equivalent or similar purpose. Thus, unless stated otherwise, each feature disclosed is one example only of a generic series of equivalent or similar features.

All of the features disclosed in this specification may be combined in any combination, except combinations where at least some of such features and/or steps are mutually exclusive. In particular, the preferred features of the invention are applicable to all aspects of the invention and may be used in any combination. Likewise, features described in non-essential combinations may be used separately (not in combination).

The invention will now be described in more detail by reference to the following examples, which are illustrative only and do not limit the scope of the invention.

Unless stated otherwise, all specific values of physical parameters like the permittivity ($\in$), charge carrier mobility ($\mu$), solubility parameter ($\delta$) and viscosity ($\eta$) as given above and below refer to a temperature of 20° C. (+/−1° C.). Ratios of monomers or repeating units in polymers are given in mol %. Ratios of polymers in polymer blends are given in weight %. The molecular weight of polymers is given as weight average molecular weight $M_w$ (GPC, polystyrene standard), unless stated otherwise. Formulation viscosities are obtained using an automated microviscometer (available for example from Anton Paar GmbH, Graz, Austria), which is based on the rolling/falling ball principle. A capillary is used in which a small metal ball rolls and by tilting this one way or the other the ball will descent through the liquid and can be timed. The length of time taken to pass a set distance through the liquid is proportional to the viscosity and the angle at which the tube is held at during this determines the shear rate of the measurement—which, for a Newtonian liquid, should not affect the recorded viscosity.

EXAMPLE 1

Preparation of Functional Compounds

Preparation of
3-(2,2-dimethoxyethyl)selanylthiophene

To a solution of iso-propylmagnesium chloride containing lithium chloride in THF (1.3 M, 100 mL, 130 mmol) is added 3-bromothiophene (21.19 g, 130 mmol) at −20° C. The reaction mixture is allowed to warm to 23° C. and stirred for 2 h, and then heated to 50° C. for another 2 h. The heating is removed and the reaction mixture was stirred for 16 h at 23° C. before cooling to 0° C. and the addition of selenium powder (10.25 g, 130 mmol). After 15 minutes, 2-bromo-1,1-dimethoxyethane (23.65 g, 140 mmol) is added. The resultant mixture is stirred for 18 h at 23° C. Water (200 mL) and ethyl acetate (200 mL) are added. The organic layer is separated and washed with water and brine, and dried over sodium sulfate. The solvent is removed under reduced pressure. The residue is purified by column chromatography on silica, eluting with petroleum ether (b.p. 40-60° C.)/ethyl acetate (10:0 to 9:1), to give the product as a yellow oil (14.04 g, 43%): $^1$H NMR (300 MHz, CDCl$_3$): $\delta$ (ppm) 7.25-7.35 (m, 2H, Ar—H), 7.12 (dd, J=4.9, 1.3 Hz, 1H, Ar—H), 4.55 (t, J=5.7 Hz, 1H, CH), 3.33 (s, 6H, CH$_3$), 2.99 (d, J=5.7 Hz); $^{13}$C NMR (75 Hz, CDCl$_3$): $\delta$132.2, 127.3, 126.4, 122.8, 103.7, 53.4, 30.7. MS (m/e): 252 (MH$^+$ 11%), 221, 189, 163, 97, 75 (100).

Preparation of selenopheno[3,2-b]thiophene

A mixture of 3-(2,2-dimethoxyethyl)selanylthiophene (13.12 g, 52.23 mmol) and polyphosphoric acid (84%, 20 ml) in chlorobenzene (150 mL) was is heated at reflux for 2 h. After cooling to 23° C., the reaction mixture is poured into water and extracted with DCM (2×100 mL). The combined extracts are dried over sodium sulphate and concentrated under reduced pressure. The residue is purified by column chromatography on silica, eluting with petroleum ether (b.p.

40-60° C.), to give the product as a white solid (4.13 g, 42%): $^1$H NMR (300 MHz, CDCl$_3$): δ (ppm) 7.95 (dd, J=5.8 and 1.3 Hz, 1H, Ar—H), 7.50 (d, J=5.8 Hz, 1H, Ar—H), 7.37 (dd, J=5.3 and 1.3 Hz, 1H, Ar—H), 7.31 (d, J=5.3 Hz, 1H, Ar—H); $^{13}$C NMR (75 Hz, CDCl$_3$): δ (ppm) 140.9, 138.6, 130.5, 126.9, 122.5, 122.0; MS (m/e): 188 (MH$^+$, 100%), 108, 93, 82, 63, 45.

Preparation of 2,5-bis(4,4,5,5-tetramethyl-1,3,2-dioxaborolan-2-yl)selenopheno[3,2-b]thiophene To a solution of selenopheno[3,2-b]thiophene (1.01 g, 5.40 mmol) in anhydrous THF (30 ml) was added BuLi solution (1.6 M in hexanes, 7.5 mL, 12.0 mmol) dropwise at −78° C. This mixture was stirred for 1 h, and 2-isopropoxy-4,4,5,5-tetramethyl-[1,3,2]dioxaborolane (2.24 g, 12 mmol) was added. The resultant mixture was allowed to warm to 23° C. and stirred overnight. The reaction mixture was poured into saturated NH$_4$Cl solution and stirred for 10 min, then extracted with ethyl acetate (3×30 mL). The combined extracts were washed with water and brine, and dried over sodium sulphate. The solvent was removed under reduced pressure to give off-white solid, which was recrystallised with THF/acetonitrile, to afford the product as white crystals (0.73 g, 31%): $^1$H NMR (300 MHz, CDCl$_3$): δ (ppm) 8.06 (s, 1H, Ar—H), 7.80 (s, 1H, Ar—H), 1.36 (s, 12H, CH$_3$), 1.35 (s, 12H, CH$_3$); $^{13}$C NMR (75 Hz, CDCl$_3$): δ (ppm)148.6, 145.6, 132.2, 131.6, 84.35, 24.8; MS (m/e): 440 (MH$^+$, 100%), 425, 397, 380, 355, 280, 240.

EXAMPLE 2

Preparation of Polymers

Polymer (1), poly[5,5'-(4,4'-dihexadecyl[2,2']bithiophene)-co-(selenopheno[3,2-b]thiophene)] is prepared:

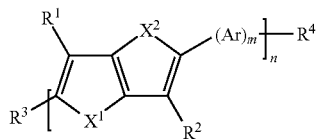

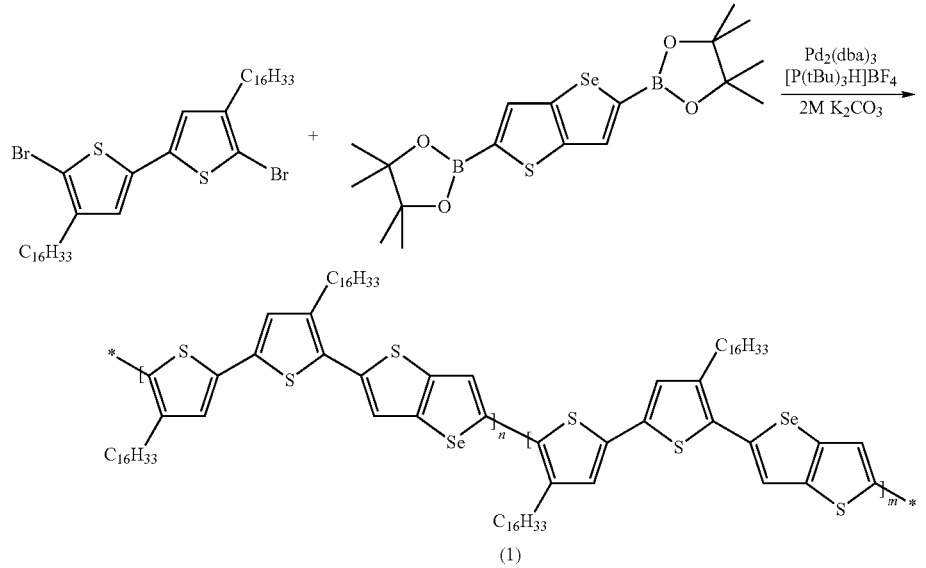

2,5-Bis(4,4,5,5-tetramethyl-1,3,2-dioxaborolan-2-yl)selenopheno[3,2-b]thiophene (0.25 g, 0.56 mmol) and 5,5'-dibromo-4,4'-dihexadecyl-2,2'-bithiophene (0.43 g, 0.56 mol) are dissolved in toluene (10 mL). Pd$_2$(dba)$_3$ (6.4 mg, 0.007 mmol), [(t-Bu)$_3$PH]BF$_4$ (7.6 mg, 0.026 mmol) and Aliquat 336 (0.5 g). The reaction mixture is degassed (via bubbling nitrogen) with stirring. A solution of K$_2$CO$_3$ (2M, 2.0 mL), which is degassed (via bubbling nitrogen), is added via syringe to the stirred reaction mixture. The resultant mixture is heated at reflux and stirred for 20 h. After cooling to 23° C., the reaction mixture is precipitated from a mixture of 37% HCl (2 mL) and methanol (50 mL) and stirred for 10 minutes. The precipitate is filtered off and washed with water and acetone, to give the crude polymer. The crude polymer is further purified by washing via Soxhlet extraction with methanol for 5 h, acetone for 15 h and iso-hexane for 7 h before drying in vacuo. The polymer is dissolved in hot chlorobenzene (10 mL) and precipitated from methanol (50 mL). The polymer is collected by filtration, washed with acetone, and dried in vacuo to yield the product as a dark red solid (0.37 g, 82%): GPC (PhCl, 60° C.): M$_n$=29,300 g mol$^{-1}$, M$_w$=73,500 g mol-1; UV/Vis (thin film): λ$_{max}$=573 nm; $^1$H NMR (300 MHz, d$_5$-PhCl; 70° C.): δ (ppm) 7.57-7.12 (4H, Ar—H), 2.96 (4H, CH$_2$), 1.88 (4H, CH$_2$), 1.35-1.65 (56H, CH$_2$), 1.03 (6H, CH$_3$).

The invention claimed is:
1. A polymer of the formula wherein
one of X$^1$ and X$^2$ is Se and the other is S or Se,
R$^1$ and R$^2$ are each independently H, halogen, —CN, —NC, —NCO, —NCS, —OCN, —SCN, —C(=O)NR$^0$R$^{00}$, —C(=O)X$^0$, —C(=O)R$^0$, —NH$_2$, —NR$^0$R$^{00}$, —SH, —SR$^0$, —SO$_3$H, —SO$_2$R$^0$, —OH, —NO$_2$, —CF$_3$, —SF$_5$, P-Sp-, optionally substituted silyl, or carbyl or hydrocarbyl with 1 to 40 C atoms that is optionally substituted and optionally comprises one or more hetero atoms, R³ and R⁴ independently of each other have one of the meanings of R¹ or are —CH₂Cl, —CHO, —CH=CH₂—SiR'R"R'", —SnR'R"R'", —BR'R", —B(OR')(OR"), —B(OH)₂, or P-Sp, wherein R', R" and R'" independently of each other have one of the meanings of R⁰ and R' and R" may also form a ring together with the hetero atom to which they are attached, P is a polymerizable group,
Sp is a spacer group or a single bond,
$X^0$ is halogen,
$R^0$ and $R^{00}$ are independently of each other H or an optionally substituted aliphatic or aromatic hydrocarbon group having 1 to 20 C atoms,
Ar in case of multiple occurrence independently is selenophene-2,5-diyl, thiophene-2,5-diyl, thieno[3,2-b]thiophene-2,5-diyl, thieno[2,3-b]thiophene-2,5-diyl, selenopheno[3,2-b]selenophene-2,5-diyl, selenopheno[2,3-b]selenophene-2,5-diyl, selenopheno[3,2-b]thiophene-2,5-diyl, selenopheno[2,3-b]thiophene-2,5-diyl, 1,4-phenylene, pyridine-2,5-diyl, pyrimidine-2,5-diyl, p-p'-biphenyl, naphthalene-2,6-diyl, benzo[1,2-b:4,5-b']dithiophene-2,6-diyl, 2,2-dithiophene, 2,2-diselenophene, thiazole and oxazole, all of which are mono- or polysubstituted by $R^{1'}$ $R^{1'}$ is halogen, —CN, —NC, —NCO, —NCS, —OCN, —SCN, —C(=O)NR⁰R⁰⁰, —C(=O)X⁰, —C(=O)R⁰, —NH₂, —NR⁰R⁰⁰, —SH, —SR⁰, —SO₃H, —SO₂R⁰, —OH, —NO₂, —CF₃, —SF₅, P-Sp-, optionally substituted silyl, or carbyl or hydrocarbyl with 1 to 40 C atoms that is optionally substituted and optionally comprises one or more hetero atoms,
m is 1, 2, 3 or 4, and
n is an integer >10.

2. The polymer according to claim 1, wherein $R^{1,2}$ are straight-chain, $C_1$-$C_{20}$-alkyl, $C_1$-$C_{20}$-alkoxy, $C_2$-$C_{20}$-alkenyl, $C_2$-$C_{20}$-alkynyl, $C_1$-$C_{20}$-thioalkyl, $C_1$-$C_{20}$-silyl, $C_1$-$C_{20}$-ester, $C_1$-$C_{20}$-amino, $C_1$-$C_{20}$-fluoroalkyl, or optionally substituted aryl or heteroaryl.

3. The polymer according to claim 1, of the following formulae

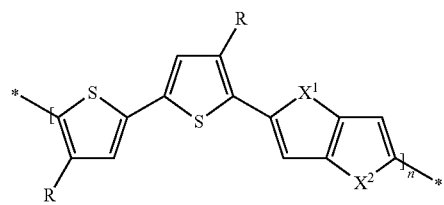
I1

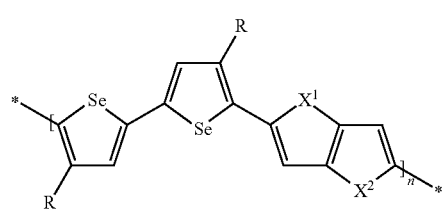
I2

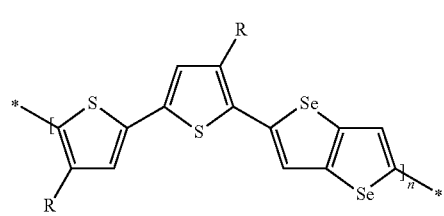
I3

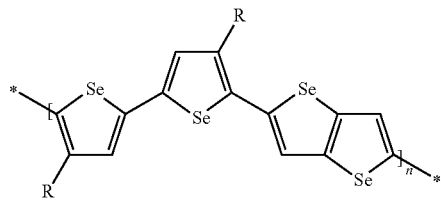
I4

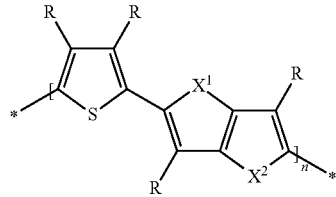
I9

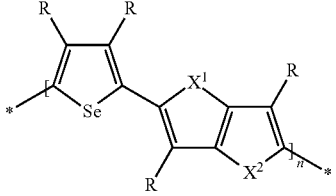
I10

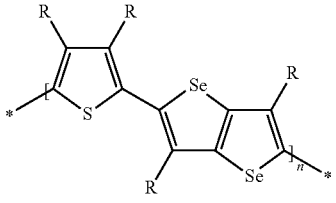
I13

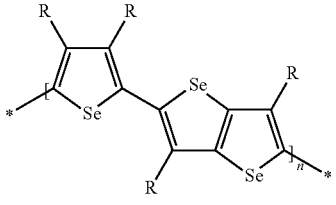
I14

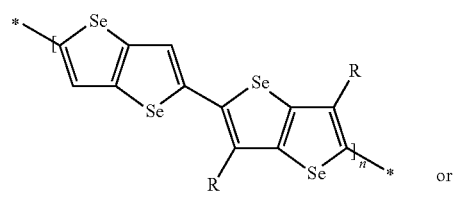
I23 or

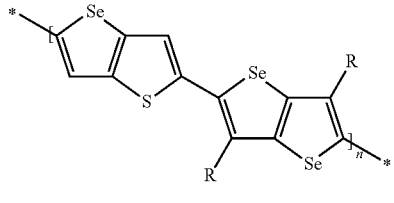
I24 wherein
independently of each other in each occurring unit one of $X^1$ and $X^2$ is S and the other is Se,
n is as defined in claim 1, and
R has in case of multiple occurrence independently of one another one of the meanings of $R^{1'}$ of claim 1.

4. A polymer blend comprising one or more polymers according to claim 1 and one or more polymers having semiconducting, charge transport, hole/electron transport, hole/electron blocking, electrically conducting, photoconducting or light emitting properties.

5. A formulation comprising one or more polymers or polymer blends according to claim 1 and one or more solvents.

6. A charge transport, semiconducting, electrically conducting, photoconducting or light emitting material or component comprising one or more polymers, polymer blends or formulations according to claim 1.

7. An optical, electrooptical or electronic component or device comprising one or more polymers, polymer blends, formulations, components or materials according to claim 1.

8. The component or device according to claim 7, that is organic field effect transistors (OFET), thin film transistors (TFT), integrated circuits (IC), logic circuits, capacitors, radio frequency identification (RFID) tags, devices or components, organic light emitting diodes (OLED), organic light emitting transistors (OLET), flat panel displays, backlights of displays, organic photovoltaic devices (OPV), solar cells, laser diodes, photoconductors, photodetectors, electrophotographic devices, electrophotographic recording devices, organic memory devices, sensor devices, charge injection layers, Schottky diodes, planarising layers, antistatic films, conducting substrates, conducting patterns, electrode materials in batteries, alignment layers, biosensors, biochips, security markings, security devices, or components or devices for detecting and discriminating DNA sequences.

9. The polymer according to claim 1, wherein $R^{1'}$ are straight-chain, $C_1$-$C_{20}$-alkyl, $C_1$-$C_{20}$-alkoxy, $C_2$-$C_{20}$-alkenyl, $C_2$-$C_{20}$-alkynyl, $C_1$-$C_{20}$-thioalkyl, $C_1$-$C_{20}$-silyl, $C_1$-$C_{20}$-ester, $C_1$-$C_{20}$-amino, $C_1$-$C_{20}$-fluoroalkyl, or optionally substituted aryl or heteroaryl.

10. The polymer of formula II according to claim 1, wherein at least one of $R^1$ or $R^2$ is not H.

* * * * *